(12) United States Patent     (10) Patent No.: US 7,428,163 B2
Hoenigschmid et al.     (45) Date of Patent: Sep. 23, 2008

(54) METHOD AND MEMORY CIRCUIT FOR OPERATING A RESISTIVE MEMORY CELL

(75) Inventors: Heinz Hoenigschmid, Poecking (DE); Gerhard Mueller, Munich (DE); Milena Dimitrova, Unterhaching (DE); Corvin Liaw, Munich (DE)

(73) Assignee: Infineon Technologies AG, Munich (JP)

( * ) Notice: Subject to any disclaimer, the term of this patent is extended or adjusted under 35 U.S.C. 154(b) by 0 days.

(21) Appl. No.: 11/459,289

(22) Filed: Jul. 21, 2006

(65) Prior Publication Data

US 2008/0019163 A1    Jan. 24, 2008

(51) Int. Cl.
*G11C 11/00* (2006.01)
(52) U.S. Cl. .................. 365/148; 365/100; 365/189.011
(58) Field of Classification Search .................. 365/100, 365/148, 189.01
See application file for complete search history.

(56) References Cited

U.S. PATENT DOCUMENTS

| 5,881,007 | A | 3/1999 | Jeong et al. |
| 6,795,359 | B1 | 9/2004 | Baker |
| 2004/0008555 | A1 | 1/2004 | Baker |
| 2004/0240294 | A1 | 12/2004 | Baker |
| 2004/0264244 | A1* | 12/2004 | Morimoto ................... 365/180 |
| 2006/0126413 | A1 | 6/2006 | Liaw |
| 2006/0209585 | A1* | 9/2006 | Tanizaki et al. ............. 365/148 |
| 2006/0227598 | A1* | 10/2006 | Sakimura et al. ........... 365/158 |

* cited by examiner

*Primary Examiner*—Son Dinh
*Assistant Examiner*—Toan Le
(74) *Attorney, Agent, or Firm*—Patterson & Sheridan, L.L.P.

(57) ABSTRACT

The invention relates to a method for reading a memory datum from a resistive memory cell comprising a selection transistor which is addressable via a control value, the method comprising detecting a cell current flowing through the resistive memory cell, setting the control value depending on the detected cell current, and providing an information associated to the control value as a memory datum.

14 Claims, 3 Drawing Sheets

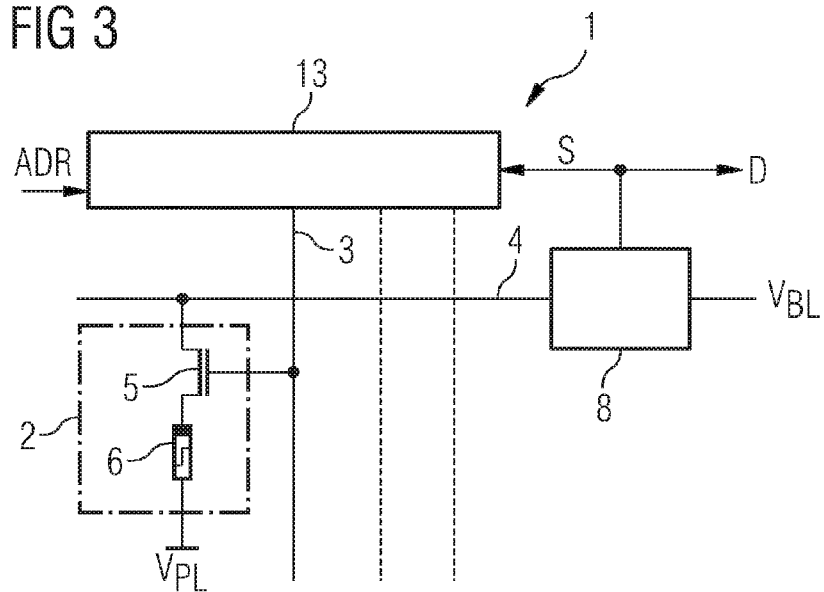
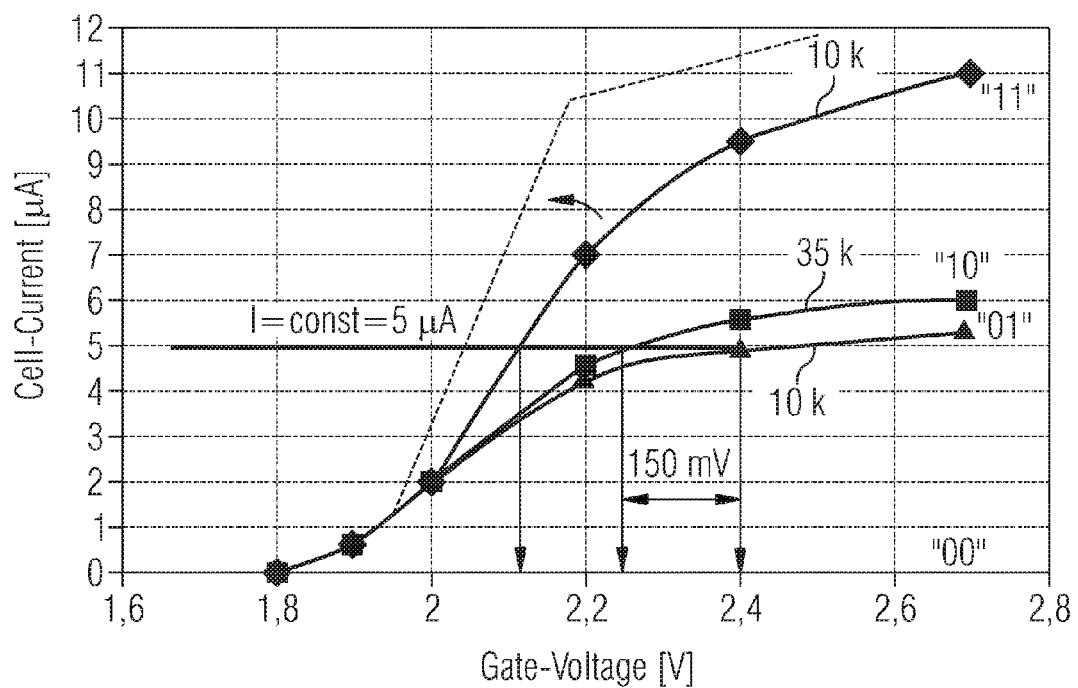

METHOD AND MEMORY CIRCUIT FOR OPERATING A RESISTIVE MEMORY CELL

BACKGROUND OF THE INVENTION

1. Field of the Invention

The invention relates to a method for reading stored data from a resistive memory cell, in particular from a conductive bridging random access memory cell (or CBRAM memory cell). The invention further relates to a memory circuit comprising a resistive memory cell.

2. Description of the Related Art

In CBRAM memory circuits, information is stored in CBRAM memory cells each comprising at least one resistive memory element. The resistive memory element may acquire various resistance states wherein by setting the resistance state of the resistive memory element the information to be stored may be determined. In order to evaluate the content of the CBRAM memory cell, it is necessary to evaluate the resistive value of the resistive memory element of the respective memory cell. This may be carried out by applying a voltage and measuring the resulting current flowing through the CBRAM memory cell. So as not to change the resistance state of the resistive memory element while reading out the information, the voltages applied to the resistive memory element for this purpose must not be outside a certain voltage range, e.g., between 100 and 200 mV. Thereby, the resistance value of the resistance state of the resistive memory element is typically between $10^4$ to $10^9 \Omega$, resulting in currents flowing through the memory cells in the range between 100 pA and 10 µA. In the circuitry typically used for CBRAM memory circuits, currents below 1 µA, however, cannot be resolved and are thus detected as 0 µA. In a single level design, i.e., in the case of a binary data storage within the CBRAM resistive memory cells, a potential sense amplifier would evaluate the current flowing through the memory cell by means of a reference current of 5 µA in order to differentiate between two logic states. In a multi-level design of the CBRAM memory circuit, the signalling current, which is already relatively low for CMOS circuitry, is further distributed to individual values. When storing 2 bits per memory cell, the cell currents amount to approximately 10 µA (state "11"), 6.66 µA (state "10"), 3.33 µA (state "01") and 0 µA (state "00"), which requires a resolution of the signaling current of at least 1.66 µA, the realization of which is complex by means of conventional circuitry.

Thus, there is a need to provide a method for reading a memory datum from a CBRAM memory cell in which the above-mentioned disadvantages can be avoided and by means of which, particularly in a multi-level design, the detecting of the state of the resistive memory element of the CBRAM memory circuit can be carried out in a reliable manner. Furthermore, there is a need to provide a CBRAM memory circuit in which the information can be read from the CBRAM memory cells in an improved manner.

SUMMARY OF THE INVENTION

According to a first aspect, a method for reading stored data from a resistive memory element is provided, the method utilizing a controllable selection transistor which is controlled by a control value. The method comprises detecting a cell current flowing through the resistive memory element, and setting the control value depending on the detected cell current and providing the stored data depending on the control value.

According to a further aspect, a memory circuit is provided for reading stored data, the memory circuit comprising a selection transistor controlled by a control value and a resistive memory element set to a resistance state. The memory circuit further comprises an evaluation unit to detect a cell current flowing through the resistive memory element in order to set the control value depending on the detected cell current and to provide stored data depending on the control value.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 is a detailed circuit diagram of a CBRAM memory circuit according to an embodiment of the present invention;

FIG. 4 is a characteristic of the cell current over the gate voltage at various resistances of the resistive memory element of the envisioned CBRAM memory cell;

DETAILED DESCRIPTION OF THE PREFERRED EMBODIMENT

Figure 1:
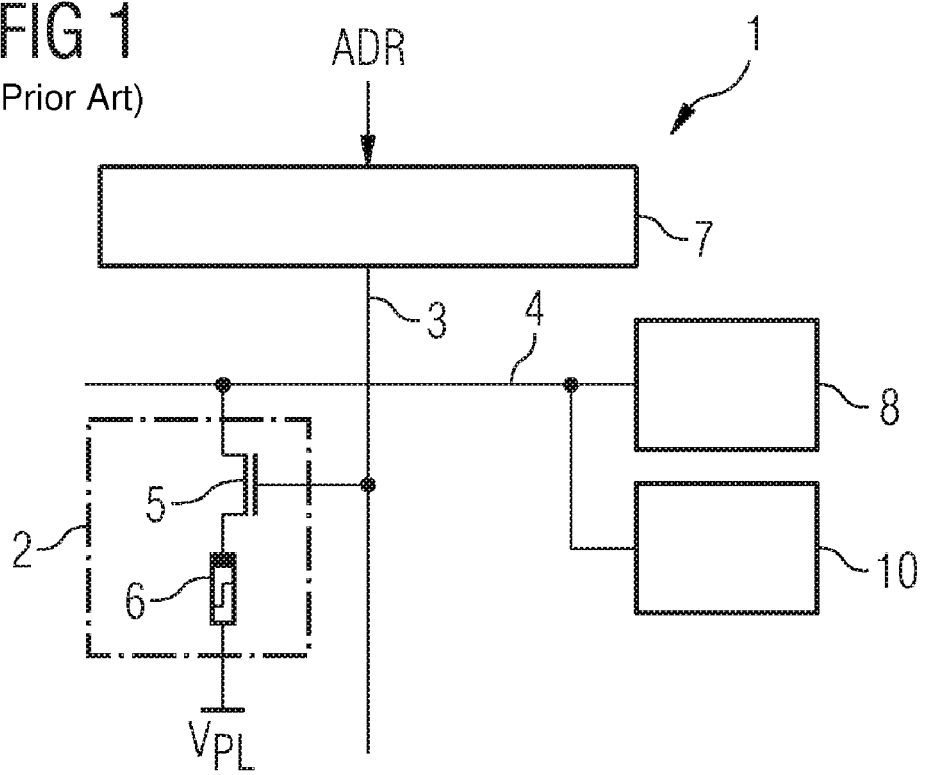
FIG. 1 is a schematic view of a conventional CBRAM memory circuit comprising a CBRAM memory cell.

FIG. 1 shows a portion of a conventional CBRAM memory circuit 1. For clarity and the ease of illustration, only one CBRAM memory cell 2 is depicted at the crossing point of the word line 3 and the bit line 4. The memory cell 2 comprises a selection transistor 5 which is connected in series with a resistive memory element 6 between the bit line 4 and a predetermined plate potential VPL provided by a plate potential source (not shown).

In detail, a first terminal (source or drain terminal) of the selection transistor 5 is connected to the bit line 4 and a second terminal (drain or source terminal) of the selection transistor 5 is connected to the first terminal of the resistive memory element 6. A first terminal of the resistive memory element 6 is connected to the plate potential VPL. A control terminal (gate terminal) of the selection transistor 5 is connected to the word line 3.

The resistive memory element 6 is configured as a CBRAM resistive memory element and is, inter alia, also called a programmable metallization cell (PMC) resistive memory element. Such a resistive memory element 6 may have differing resistance states having different resistance values depending on a programming state. Programming of the resistive element 6 may take place by applying a programming voltage across the resistive element 6 which results in the resistive memory element assuming a resistance state having first low resistive value. By means of an erase voltage, which usually has an inverted polarity compared to the programming voltage, the resistive memory element may be set to a resistance state with a second high resistive value. The programming and erasing of the resistive memory element 6 may be carried out by establishing and degrading an electrically conductive path from a conductive material, such as Ag, migrating in a solid state electrolyte. The functionality of such a resistive memory element is well known from the art and will not be described herein in more detail.

Instead of a CBRAM resistive memory element, other resistive memory elements which can acquire different resistance states with different resistive values, may be used in connection with the embodiments of the CBRAM memory circuit described in the following.

The addressing of the memory cell 2 may be carried out by activating the word line 3, i.e., an activation signal is applied to the word line, thereby (rendering conductive) closing the selection transistor 5 so that the bit line 4 is connected to the resistive memory element 6 via the conductive selection transistor 5. The read operation may be performed by means of the read circuit 8, which applies a predetermined potential to the bit line 4 and evaluates the current flowing via the bit line 4 and through the addressed resistive memory element 6. Depending on the amount of current, the resistance state of the memory cell 2 is determined.

The reading of a multi-bit memory cell, i.e., of a memory cell which may comprise more than two resistance states, may be carried out in the same manner, wherein by applying the read voltage to the bit line the range is determined in which the resulting current flowing through the memory cell. Depending on the range in which the current flowing through the memory cell is located, a specific resistance state may be assigned to the memory cell, and corresponding stored data may be output.

The embodiment describes the CBRAM memory cell 2 comprising a programming circuit 10, to which a predetermined programming current with a direction depending on the datum to be written is typically applied via the bit line 4 through the activated memory cell 2, in order to selectively set the resistive memory element 6 of the memory cell 2 to a high resistance state or to a low resistance state. In a multi-level memory cell, the programming circuit 10 can be configured in such a way that the resistance value of the resistive memory element 6 is brought into a certain range which corresponds to a certain resistance state of the CBRAM memory cell 2. The programming current is applied to the bit line 4 by means of a current level within the programming circuit so that a bit line potential is put on the bit line programming or, respectively, erasing the resistive memory element 6 of the resistive memory cell 2. In particular, during programming, i.e., the operation in which the resistive memory element 6 is brought to a low resistive state, a current peak may occur due to the capacity of the bit line when the current increasing as a result of the decreasing resistive value of the resistive memory element 6 is provided from the charge stored on the bit line 4. The increased current flowing through the resistive memory element 6 considerably exceeds the current provided by the programming circuit 10, which may lead to damage at the resistive memory element 6.

Figure 2:
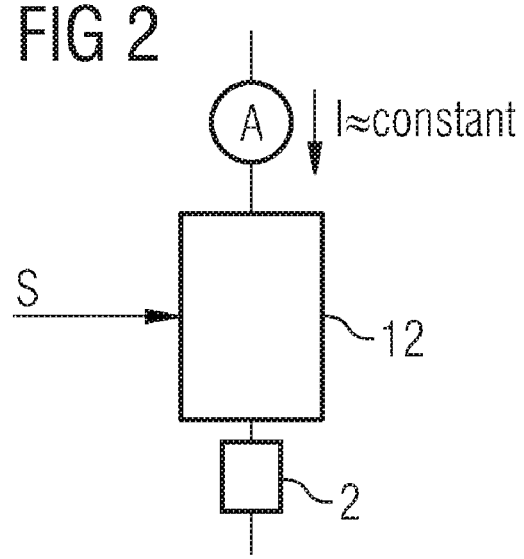
FIG. 2 is a block diagram of the CBRAM memory circuit according to an embodiment.

Conventionally, the detecting of current flowing through the memory cell during reading is particularly difficult in a multi-level memory cell, since the detected currents are very low so that they cannot be reliably detected by a corresponding evaluation circuit in a sufficiently precise manner to be able to reliably associate them with a certain state. As shown in FIG. 2, one embodiment provides the reading-out of a memory cell with a current I flowing through the memory cell 2 which is consistently controlled by means of a control unit 12. The control value S required by the control unit 12 in order to do so may be assigned to a resistance state of the memory cell 2.

FIG. 3 shows a detailed view of one embodiment of a memory circuit. Same reference numerals correspond to elements of the same or of comparable functions. The memory circuit of FIG. 3 generally follows the concept of using the selection transistor 5, e.g., a field-effected transistor such as a MOSFET, as a part of the control circuit 10, wherein the selection transistor 5 is no longer closed or opened according to an applied word line address, but is addressed by means of a suitably analogous activation potential via the word line 3 in such a way that a predetermined current flows via the respective bit line 4 through the memory cell 2. This is achieved by the read circuit 8 applying a predefined bit line potential VBL to the bit line 4 and the control value S to the word line 3 to be addressed. The applying is carried out by means of a word line decoder 13 applying the control potential to that word line to be activated depending on an applied word line address ADR, and deactivates the remaining word lines 3 with a potential, such as the plate potential VPL or a ground potential, so that the respective selection transistors 5 are completely (non-conductively) opened. In an adjusted state, i.e., when the predetermined current flows via the bit line 4 and through the memory cell 2, the control value S may be assigned to a datum D to be read out from the memory cell 2. The control value S corresponds to a respective discrete potential from a set of potential values which due to the characteristic of the selection transistor 5 in the memory cell 2 comprises a sufficient potential distance for the various resistance states of the resistive memory element 6 from each other.

FIG. 4 shows an exemplary characteristic of an exemplary memory cell comprising four different resistance states of the resistive memory element 6. The various resistive values of the resistance states are 10 kΩ, 35 kΩ, 50 kΩ and 1 MΩ. When a consistent current of 5 μA flows through the memory cell in a first resistance state in which the resistive memory element 6 comprises a resistive value of 10 kΩ, the control potential which is applied to the selection transistor 5 amounts to 2.1 V, while in a second state, in which the resistive value of the resistive element is 35 kΩ, the control potential amounts to 2.25 V, in a third state, in which the resistive value of the resistive element 6 is 50 kΩ, the control potential amounts to 2.4 V, and in a fourth state, in which the resistive memory element 6 is highly resistive at 1 MΩ, with voltages typically used in the memory circuit, the consistent current of 5 μA cannot be achieved and thus essentially amounts to 0 μA.

Figure 5:
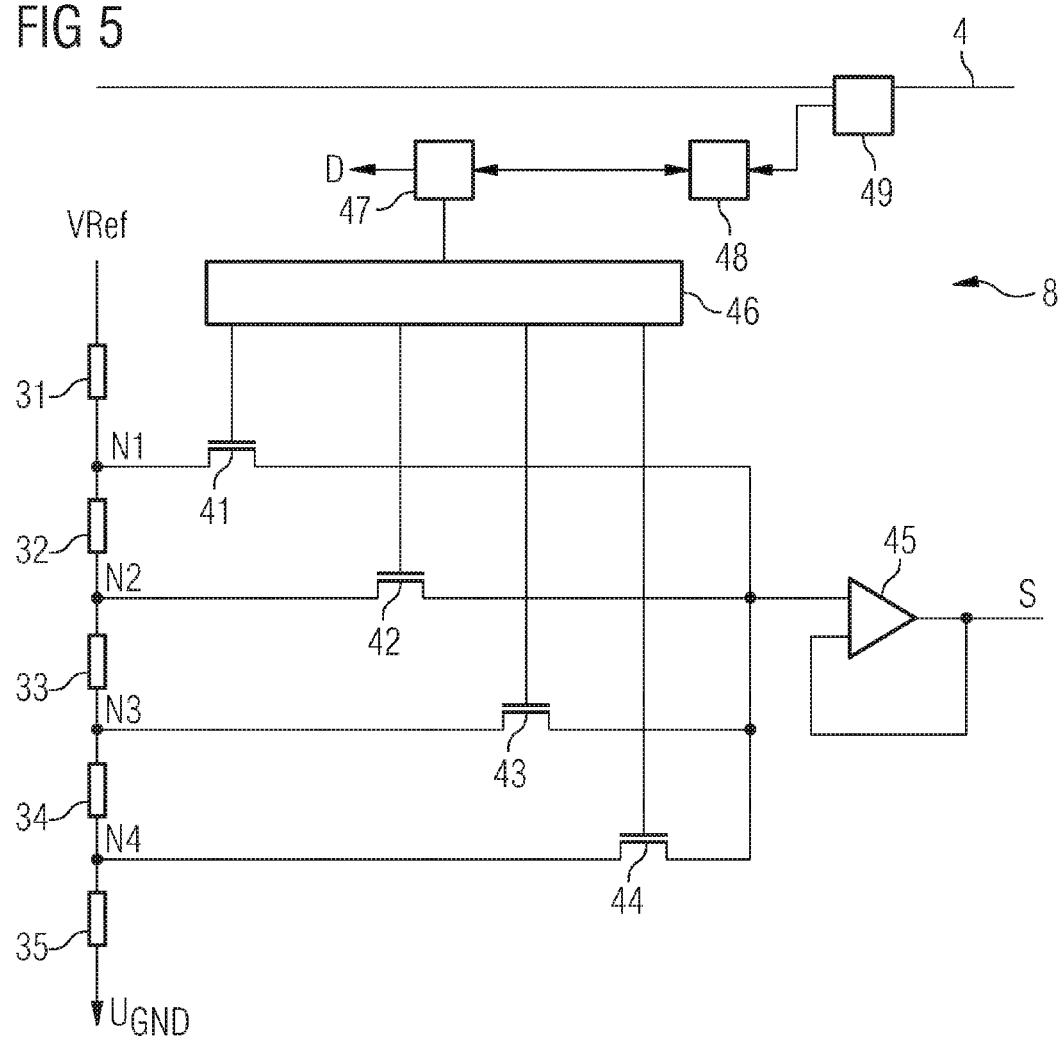
FIG. 5 is a detailed schematic view of the read circuit for the CBRAM memory circuit.

FIG. 5 depicts the read circuit 8 in more detail. The read circuit 8 generates the control value S by suitably providing the potential from a voltage divider which is formed by a plurality of resistors 31 to 35. The first to fifth resistors 31 to 35 are connected in series between a reference potential and a ground potential $V_{GND}$. A first node N1 between the first resistor 31 and the second resistor 32 is connected via a first transistor 41 to the input of a driver 45. A second node N2 between the second resistor 32 and the third resistor 33 is connected via a second transistor 42 to the input of the driver 45. A third node N3 between the third resistor 33 and the fourth resistor 34 is connected via a third transistor 43 to the input of the driver 45. A fourth node N4 between the fourth resistor and the fifth resistor 35 is connected via a fourth transistor 44 to the input of the driver 45. Thereby, a kind of an analog demultiplexer is formed.

An output driver 45 may be configured as a feedback coupled operational amplifier which outputs the voltage applied to the first input and supplied by the selected one of the transistors 41 to 44 as the control value S. The control terminals of the transistors 41 to 44 are each connected to a decoder 46, which depending on the counting value of a counter 47 closes one of the transistors 41 to 44, respectively, and brings or maintains the respective other transistors into or in an open state. A control unit 48 starts a read operation by counting up the counter 47, so that each of the transistors 41 to 44 is successively closed, while the other transistors are opened, respectively.

The bit line 4 is connected to a voltage source via a current detector 49 in such a way that, e.g., a potential with the amount of a supply potential is provided. The current detector 49 includes a comparing unit to detect the current flowing via bit line 4 with respect to a reference value (reference current $I_{REF}$) and outputs a corresponding comparison signal.

The counting-up of the counter 47 is stopped when, as determined by the current detector 49, the current on the bit line 4 exceeds or falls below the predetermined current, depending on whether the control voltages applied to the selection transistor 5 increases or falls due to the successive switching of the transistors 41 to 44. When the current flowing through the bit line 4 reaches the predetermined current, the current counter value is output as the stored datum D. Alternatively, when the current flowing through the bit line 4 exceeds or falls below the predetermined current, the current counter value is output as the stored datum D.

In the present embodiment, the read circuit 8 of FIG. 5 may be utilized to detect four different states when the counter 47 is provided as a 2-bit-counter. It is then possible to realize a multi-bit memory circuit in which 2 bits can be stored in each memory cell. In a configuration leading to an electrical behavior corresponding to the characteristic of FIG. 3, the respective voltages may be generated from the resistors 31 to 35 by means of the voltage divider. In order to evaluate the multi-bit memory cell corresponding to the characteristic of FIG. 4, voltages should then be provided to the nodes N1 to N4 which define the limits of the various resistance state ranges which may be set in the memory cell. In the shown example, this may be the voltages of 2.175, 2.325 and 2.6 V. In this case, only three read voltages need to be provided at the three nodes N1 to N3 for reading out the four different states from the multi-bit memory cell, in order to detect four states of the multi-bit memory cell.

Figure 6:
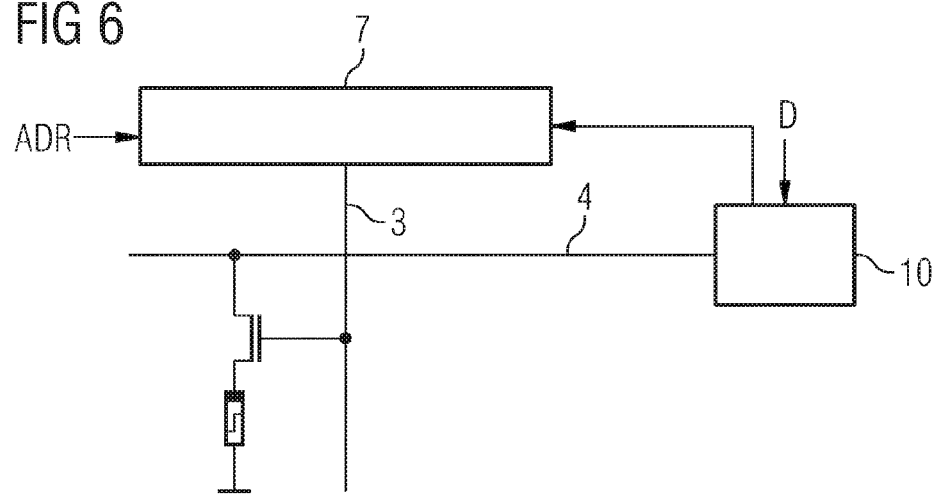
FIG. 6 is a schematic view of the write circuit for the CBRAM memory circuit.

FIG. 6 shows a memory circuit according to a further embodiment in which a control value is applied to the addressed word line 3 via the word line decoder 7 in order to write into the memory cell in such a way that a peak current, which may occur during the transition from a high to a low resistive state of the resistive element, is limited. For this purpose, the programming circuit 10 provides a programming voltage by means of which the resistive element of the addressed memory cell may be brought from a high resistive to a low resistive state. Contrary to conventional CBRAM memory circuits, the word line 3 may be activated in such a way that the selection transistor 5 connects the resistive element 6 to the bit line so that a programming operation is started. If the resistive value of the resistive element 6 falls, the current flowing through the memory cell increases which may be detected by the programming circuit 10, e.g., by means of a current detector 49 in accordance with the current flowing via bit line 4. If the current flowing through the memory cell exceeds a limit, the potential of the control value is reduced via the word line decoder 7 on the word line 3, so that the source-drain resistance of the selection transistor 5 is increased, which may limit the current. In this way, the current flowing through the resistive memory element of the memory cell 2 may be limited so that damage of the memory cell can be avoided.

In summary, a method for reading data, according to one embodiment, provides that the control value addressing the selection transistor, which is set depending on the detected cell current, determines the information in the resistive memory cell. For this purpose, the cell current flowing through the resistive memory element is compared to a reference current, and the control value is set depending on the result of the comparison. Typically, the control value is set such that the cell current refers to the reference current. The various resistive values of the resistive memory element within the resistive memory cell lead to different control values of the selection transistor if the cell current of the resistive memory element is to be kept constant. By means of the different gate voltages of the selection transistors at various resistive values of the resistive memory elements, a simple evaluation of the resistive memory cell's state can be carried out since, due to the different increases of the cell-current-gate-voltage-characteristics, easily detectable voltage differences are obtained for the resistive memory cell depending on the resistive value of the resistive memory element in the resistive memory cell.

According to another embodiment, a measuring value is applied to the selection transistor and changed until a sign of the difference between the cell current and the reference current changes, wherein the measuring value at which the sign of the difference changes, is set as the control value.

Furthermore, the measuring value may be changed by discrete values.

Furthermore, the measuring value may be selected from a number of different values, wherein when the sign of a difference between the cell current and the reference current changes between successively applied measuring values, the last-applied measuring value is set as the control value.

Particularly, the number of different values of the control value is selected from a number of detectable resistance states of the resistive memory cell diminished by 1.

According to a further aspect, a memory circuit is provided for reading stored data, the memory circuit comprising a selection transistor which is controlled by a control value and a resistive memory element which is set to a resistance state. The memory circuit further comprises a read unit to detect a cell current flowing through the resistive memory element in order to set the control value depending on the detected cell current and to provide stored data depending on the control value.

The evaluation unit may comprise a comparison unit in order to compare a cell current flowing through the resistive memory cell to a reference current, as well as a control unit in order to set the control value depending on the result of the comparison.

Moreover, the control unit may be configured to set the control value in such a way that the cell current corresponds to the reference current.

The control unit may comprise a measuring unit in order to apply a measuring value to the selection transistor and to change the measuring value until the comparison unit detects that a sign of the difference between the cell current and the reference current has changed. The control unit may be configured to set the measuring value at which the sign of the difference changes as the control value. Thereby, the measuring unit may be configured to change the measuring value by discrete values.

Furthermore, it may be provided that the measuring circuit selects the measuring value from a number of different values, wherein the control unit sets the last-applied measuring value as the control value when the sign of a difference between the cell current and the reference current IREF changes between successively applied measuring values.

While the foregoing is directed to embodiments of the present invention, other and further embodiments of the invention may be devised without departing from the basic scope thereof, and the scope thereof is determined by the claims that follow.

What is claimed is:

1. A method for reading data stored in a resistive memory element, the method comprising:
   detecting a cell current flowing through the resistive memory element, wherein the resistive memory element comprises a controllable selection transistor which is controlled by a control value;
   setting the control value based on the detected cell current; and
   providing the data depending on the set control value.

2. The method of claim 1, wherein the detecting of the cell current flowing through the resistive memory element comprises comparing the cell current with a reference current, and wherein the control value is set based on a result of the comparing.

3. The method of claim 2, wherein the control value is set such that the cell current substantially equals the reference current.

4. The method of claim 3, wherein setting the control value comprises:
   applying a measuring value to the selection transistor; and
   changing the applied measuring value until a sign of a difference between the cell current and the reference current changes, wherein the measuring value at which the sign of the difference changes is set as the control value.

5. The method of claim 4, wherein the measuring value is changed by discrete values.

6. The method of claim 5, wherein the measuring value is selected from a plurality of different values, and wherein, when the sign of the difference between the cell current and the reference current changes between successively applied measuring values, a last-applied measuring value is set as the control value.

7. The method of claim 6, wherein the plurality of different values of the control value corresponds to a number of pre-determined resistance states of the resistive memory cell to be detected diminished by one.

8. A memory circuit for reading stored data, comprising:
   a selection transistor which is controlled by a control value,
   a resistive memory element which is set to a resistance state; and
   a read unit configured to detect a cell current flowing through the resistive memory element, to set the control value depending on the detected cell current and to provide the data depending on the control value.

9. The memory circuit of claim 8, wherein the read unit comprises:
   a comparing unit for compare the cell current flowing through the resistive memory cell to a reference current; and
   a control unit for setting the control value depending on the result of the comparison.

10. The memory circuit of claim 9, wherein the control unit is configured to set the control value such that the cell current substantially equals the reference current.

11. The memory circuit of claim 10, wherein the control unit comprises:
    a measuring circuit configured to apply a measuring value to the selection transistor and to change the measuring value until the comparing unit detects that a sign of a difference between the cell current and the reference current has changed, wherein the comparing unit causes the control unit to set the measuring value at which the sign of the difference has changed as the control value.

12. The memory circuit of claim 11, wherein the measuring circuit changes the measuring value by discrete values.

13. The memory circuit of claim 12, wherein the measuring circuit selects the measuring value from a plurality of different values, and wherein the control unit sets a last-applied measuring value as the control value when the sign of a difference between the cell current and the reference current changes between successively applied measuring values.

14. The memory circuit of claim 13, wherein the plurality of different values of the control value corresponds to a number of resistance states of the resistive memory element to be detected diminished by one.

* * * * *